(12) United States Patent
Mochizuki et al.

(10) Patent No.: US 7,829,858 B2
(45) Date of Patent: Nov. 9, 2010

(54) RADIATION DETECTING APPARATUS, AND RADIATION IMAGE PICKUP SYSTEM

(75) Inventors: Chiori Mochizuki, Sagamihara (JP); Minoru Watanabe, Honjo (JP); Takamasa Ishii, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 365 days.

(21) Appl. No.: 11/917,334

(22) PCT Filed: Jul. 21, 2006

(86) PCT No.: PCT/JP2006/314931
§ 371 (c)(1),
(2), (4) Date: Dec. 12, 2007

(87) PCT Pub. No.: WO2007/013570
PCT Pub. Date: Feb. 1, 2007

(65) Prior Publication Data
US 2009/0283689 A1  Nov. 19, 2009

(30) Foreign Application Priority Data
Jul. 25, 2005 (JP) .............................. 2005-214226

(51) Int. Cl.
*G01T 1/24* (2006.01)
(52) U.S. Cl. .................................. 250/370.01
(58) Field of Classification Search ........... 250/366, 250/367, 368, 369, 370.01, 370.08, 370.09, 250/370.11
See application file for complete search history.

(56) References Cited

U.S. PATENT DOCUMENTS 4,390,791 A   6/1983   Hatanaka et al.
(Continued)

FOREIGN PATENT DOCUMENTS

EP   1 176 814 A2   1/2002
(Continued)

OTHER PUBLICATIONS

PCT International Search Report and Written Opinion of the International Searching Authority; Mailing Date Oct. 3, 2006.
(Continued)

*Primary Examiner*—David P Porta
*Assistant Examiner*—Mark R Gaworecki
(74) *Attorney, Agent, or Firm*—Fitzpatrick, Cella, Harper & Scinto

(57) ABSTRACT

In a radiation detecting apparatus of the invention, plural pixels are arranged, and the pixel has a conversion element converting a radiation into an electric signal and a switching element connected to the conversion element. The conversion element includes a first electrode disposed on a first surface of an insulating substrate, a second electrode disposed on the first electrode, and a semiconductor layer disposed between the first electrode and the second electrode. The first electrode is made of a light-transmitting conductive material which transmits light emitted from a light source, and the first electrode is formed form a light transmitting electroconductive material transmitting light emitted form a light source disposed on a second surface of the insulating substrate opposite to the first surface. The switching element has a light shielding member which prevents incidence of the light from the light source to the switching element.

16 Claims, 6 Drawing Sheets

U.S. PATENT DOCUMENTS

| | | |
|---|---|---|
| 5,138,655 A | 8/1992 | Takashima et al. |
| 5,142,567 A | 8/1992 | Watanabe |
| 5,572,255 A * | 11/1996 | Murakami et al. .......... 348/294 |
| 5,965,872 A | 10/1999 | Endo et al. |
| 6,049,074 A | 4/2000 | Endo et al. |
| 6,236,579 B1 | 5/2001 | Watanabe et al. |
| 6,753,915 B1 | 6/2004 | Mochizuki |
| 6,782,187 B1 | 8/2004 | Fujimoto et al. |
| 6,847,039 B2 | 1/2005 | Mochizuki |
| 6,881,945 B2 | 4/2005 | Ishii et al. |
| 6,965,111 B2 | 11/2005 | Endo |
| 6,984,813 B2 | 1/2006 | Ishii et al. |
| 6,989,540 B2 | 1/2006 | Morii et al. |
| 7,030,385 B2 | 4/2006 | Mochizuki |
| 7,034,309 B2 | 4/2006 | Mochizuki |
| 7,126,158 B2 | 10/2006 | Morii et al. |
| 7,214,945 B2 | 5/2007 | Nomura et al. |
| 7,315,028 B2 | 1/2008 | Mochizuki |
| 2002/0014592 A1 | 2/2002 | Rutten et al. |
| 2006/0119719 A1 | 6/2006 | Kameshima |

FOREIGN PATENT DOCUMENTS

| | | |
|---|---|---|
| JP | 56-138964 A | 10/1981 |
| JP | 56-138965 A | 10/1981 |
| JP | 62-142351 A | 6/1987 |
| JP | 63-269569 A | 11/1988 |
| WO | 98/01992 | 1/1998 |
| WO | 2004/073068 | 8/2004 |
| WO | 2005/050982 A1 | 6/2005 |

OTHER PUBLICATIONS

Chinese Office Action dated Apr. 14, 2010 issued during prosecution of related Chinese Patent Application No. 200680027166.6.

* cited by examiner

RADIATION DETECTING APPARATUS, AND RADIATION IMAGE PICKUP SYSTEM

TECHNICAL FIELD

The present invention relates to radiation detecting apparatus which detects radiation such as visible light, an infrared ray, X-ray, an alpha ray, a beta ray and a gamma ray. Particularly the invention relates suitable to a radiation detecting apparatus which detects the radiation such as the X-ray, the alpha ray, the beta ray and the gamma ray, and the radiation detecting apparatus is applied to a medical diagnostic imaging system, nondestructive inspection apparatus, and analytical apparatus in which the radiation is used.

In the description, the radiation shall include the light such as the visible light and the infrared ray and the ionizing radiation such as the X-ray, the alpha ray, the beta ray and the gamma ray. A conversion element is an element which converts the radiation into electric signal. The conversion element shall include an photoelectric conversion element which converts the light such as the visible light and the infrared ray into the electric signal and a semiconductor element which converts the radiation such as the X-ray, the alpha ray, the beta ray and the gamma ray into the electric signal. The wavelength converter shall convert the incident radiation such as the X-ray and the gamma ray into the light having a wavelength range which can be detected by the photoelectric conversion element.

BACKGROUND ART

A conversion element in which a non-single crystalline semiconductor such as hydrogenated amorphous silicon (hereinafter abbreviated to a-Si) is used is well known as the conversion element which converts the radiation including the light such as the visible light, the infrared ray, the X-ray, the alpha ray, the beta ray and the gamma ray into the electric signal. A radiation detecting apparatus in which a flat panel detector (hereinafter abbreviated to FPD) is used receives attention as the radiation detecting apparatus in which the conversion element is used. In FPD, plural pixels are arranged in a two-dimensional matrix. The pixel includes a conversion element prepared by a non-single crystalline semiconductor on an insulating substrate and a switching element such as a thin film transistor (hereinafter abbreviated to TFT) prepared by the non-single crystalline semiconductor. In FPD, the conversion element converts the radiation having image information into a charge while a predetermined bias is applied to the conversion element, and the electric signal based on the image information can be obtained by reading the charge with the switching element. For the conversion element made of the non-single crystalline semiconductor, sometimes long-time bias application to the conversion element induces degradation of sensor characteristics. Therefore, there is an attempt that the degradation of sensor characteristics is reduced due to the long-time use by applying a zero-potential bias to the conversion element except in taking the image while applying a predetermined bias to the conversion element only in taking the image. However, when the predetermined bias is applied to the conversion element only in taking the image, unnecessary current is generated by the charge and the like trapped by a defect energy level in the non-single crystalline semiconductor, and sometimes sensitivity which is of a signal-to-noise ratio is decreased due to the noise caused by the unnecessary current. The unnecessary current generated by the charge trapped by the defect energy level is an intrinsic problem of the non-single crystalline semiconductor.

It is possible that the decrease in sensitivity caused by the unnecessary current is reduced by providing a standby period during which the signal is not read from the conversion element for a given interval after the predetermined bias is applied to the conversion element. However, from the viewpoint of immediacy, it is necessary to improve the standby period in the actual apparatus operation, because the standby period during which the signal is not read from the conversion element is provided.

Therefore, as disclosed in US Patent Publication No. 2002/0024016, there is well known a drive method and an apparatus, in which the photoelectric conversion element which is of the conversion element made of a-Si is irradiated with the light not having the image information before the radiation, and thereby the conversion element can take the image immediately after the predetermined bias is applied to the conversion element. The apparatus disclosed in the US Patent Publication No. 2002/0024016 has a structure in which a light source for emitting the light not having the image information is arranged on the backside of the substrate in which the photoelectric conversion element is provided, the light from the light source is transmitted through the photoelectric conversion element or between the pixels, and the light is accepted by a light acceptance surface of the photoelectric conversion element. US Patent Publication No. 2002/0014592 also discloses a similar configuration.

The improvement of the sensitivity, i.e., the improvement of output and the noise reduction are always demanded in the photoelectric conversion element. Specifically, the improvement of a numerical aperture which is of an occupied area ratio of the conversion element in one pixel can be cited as an example of the improvement of the output. On the other hand, the reduction of interconnection resistance, i.e., the increase in width of each interconnection can be cited as an example of the noise reduction. That is, in order to obtain the high-performance radiation detecting apparatus, it is necessary that the increase in interconnection width and the improvement of the numerical aperture be simultaneously achieved.

Therefore, there is thought a method in which the numerical aperture is increased or the interconnection width is widened by decreasing a space between the conversion element and the switching element or a space between the conversion element and the signal interconnection or drive interconnection in one pixel. However, in the above method, although the sensitivity is improved, because the space through which the light from the substrate backside passes is reduced, a necessary light irradiation time becomes lengthened from the substrate backside in order to compensate the decrease in sensitivity according to the space reduction. That is, the operation immediacy is lost.

In the above method, it is possible that a high-output light source is used to simply secure the operation immediacy and to achieve the maximum sensitivity. The high-output light source arranged in the backside of the substrate emits the light not having the image information. However, the compact apparatus cannot be formed, and sometimes cost increase is induced.

When the light irradiation is performed from the substrate backside, the switching element such as a TFT is also irradiated with the light in addition to the conversion element. Therefore, there is a possibility that a switching function is lost in the switching element because the photoelectric conversion is also generated in the switching element which is of the semiconductor element.

DISCLOSURE OF THE INVENTION

In view of the foregoing, an object of the invention is to provide a device structure in which the light not having the image information is caused to be selectively incident from the backside to the conversion element such as the photoelectric conversion element, and radiation detecting element having high sensitivity and high immediacy.

The present invention provides an radiation detecting apparatus in which plural pixels are arranged, the pixel having a conversion element converting an radiation into an electric signal and a switching element connected to the conversion element, the conversion element including a first electrode disposed on a first surface of an insulating substrate, a second electrode disposed on the first electrode, a semiconductor layer disposed between the first electrode and the second electrode, wherein the first electrode is formed from a light transmitting electroconductive material transmitting light emitted from a light source disposed on a second surface of the insulating substrate opposite to the first surface, and the switching element has a light shielding member which prevents incidence of the light from the light source to the switching element.

The present invention provides a radiation detecting apparatus, wherein a wavelength converter is disposed, the wavelength converter converting radiation incident to the photoelectric conversion element into light having a wavelength range which can be detected by a photoelectric conversion element.

The present invention provides a radiation detecting apparatus, wherein the conversion element is a semiconductor element which converts incident radiation such as the X-ray, the alpha ray, the beta ray and the gamma ray into an electric signal.

A radiation image pickup system of the invention is one in which the radiation detecting apparatus of the invention is used.

According to the invention, the substrate-side electrode of the conversion element which converts the radiation into the electric signal is formed by the light transmitting material, and the light can be incident from the substrate-side electrode while the light incidence to the semiconductor layer which is of the switching element such as the thin film transistor is suppressed. Therefore, the panel characteristics are stabilized, and the high-reliability radiation detecting apparatus can be realized with out losing the immediacy.

Further, when the conversion element is provided on the switching element such as the thin film transistor, the sensitivity can simultaneously be improved.

Other features and advantages of the present invention will be apparent from the following description taken in conjunction with the accompanying drawings, in which like reference characters denote the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

BEST MODE FOR CARRYING OUT THE INVENTION

First Embodiment

A radiation detecting apparatus according to a first embodiment will be described below. In the radiation detecting apparatus of the first embodiment, a scintillator layer which is of the wavelength converter is disposed over a substrate having pixels. The pixel includes a MIS type sensor which is of the conversion element and a TFT (thin film transistor) which is of the switching element.

Figure 1:
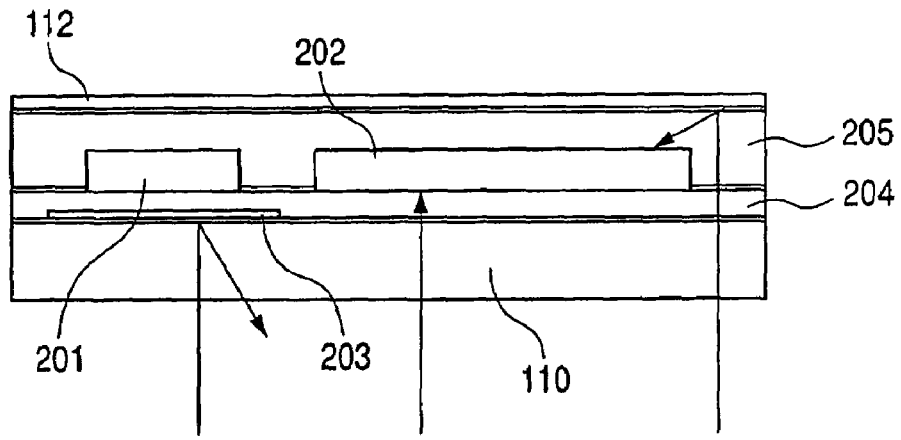
FIG. 1 is a schematic sectional view showing one pixel of a radiation detecting apparatus according to a first embodiment of the invention.

FIG. 1 is a schematic sectional view showing one pixel of the radiation detecting apparatus of the first embodiment of the invention. Referring to FIG. 1, the reference numeral 110 denotes a light-transmitting insulating substrate such as a glass substrate, and the reference numeral 112 denotes a scintillator layer made of cesium iodide (CsI). The scintillator layer 112 is a wavelength converter for converting the incident radiation such as the X-ray into the light such as the visible light and the infrared ray having the wavelength which can be detected by the MIS type sensor. The reference numeral 201 denotes a TFT which is of the switching element, the reference numeral 202 denotes an MIS type sensor which is of the conversion element, the reference numeral 203 denotes a light shielding layer made of Al or the like, the reference numeral 204 denotes a first interlayer insulating layer, and the reference numeral 205 denotes a second interlayer insulating layer. The first interlayer insulating layer 204 and the second interlayer insulating layer 205 transmit both the light from the scintillator layer 112 and the light transmitted through the light-transmitting insulating substrate 110 from a light source arranged on the backside.

The light shielding layer 203 made of an Al alloy or the like is formed on the insulating substrate 110 such as the glass substrate, SOG (solution in which $SiO_2$ is dissolved in a solvent) is applied on the light shielding layer 203, and the first interlayer insulating layer (becoming the light-transmitting insulating layer) 204 which functions as a planarization layer is formed by baking the substrate. Then, the TFT and the MIS type sensor are formed.

The TFT 201 includes a gate electrode, a gate insulating layer, a semiconductor layer made of a-Si and the like, an impurity semiconductor layer which functions as an ohmic contact layer, and a source and drain electrode in the order from the substrate (first interlayer insulating layer) side. The MIS type sensor 202 includes a lower electrode (electrode on the substrate side), an insulating layer, the semiconductor layer made of a-Si and the like, the impurity semiconductor layer which functions as an ohmic contact layer, and an upper electrode (electrode on the side opposite to the substrate) in the order from the substrate (first interlayer insulating layer) side. That is, the TFT and the MIS type sensor have the similar layer configuration. The lower electrode (electrode on the substrate side) of the MIS type sensor is made of ITO which is of the light-transmitting conductive material, and the gate electrode of the TFT is also made of ITO.

When the lower electrode of the MIS type sensor 202 which is of the conversion element is formed by the light transmitting material, the MIS type sensor 202 can efficiently be irradiated with light through the lower electrode. Therefore, for example, as disclosed in US Patent Publication No. 2002/0024016, the method in which the image can immediately be read by performing the light irradiation prior to the reading operation can be adopted to immediately read the image. As shown in FIG. 1, the radiation detecting apparatus of the first embodiment has a structure in which the light is incident from the lower electrode of the MIS type sensor 202 as shown by an arrow of FIG. 1 when the backside (surface opposite to the surface in which the MIS type sensor 202 is formed) of the substrate 110 is irradiated with the light. The radiation detecting apparatus also has a structure in which the light transmitted through a space existing around the MIS type sensor is reflected by the scintillator layer 112 and the light is incident to a light acceptance surface of the sensor. Particularly, in consideration of light absorption or sensor capacity reduction (noise reduction), the semiconductor layer is formed in the thick film. Therefore, the light is incident from both surfaces of the backside and the light acceptance surface, which allows the light to be efficiently incident to the whole of the semiconductor layer. On the other hand, even if the backside (surface opposite to the surface in which the MIS type sensor 202 is formed) of the substrate 110 is irradiated with the light, the light shielding layer 203 blocks the light incident to the TFT 201 to prevent malfunction. Desirably an area of the light shielding layer 203 is formed larger than that of a TFT channel region such that the light from the light source is not incident to the TFT channel region.

Figure 2:
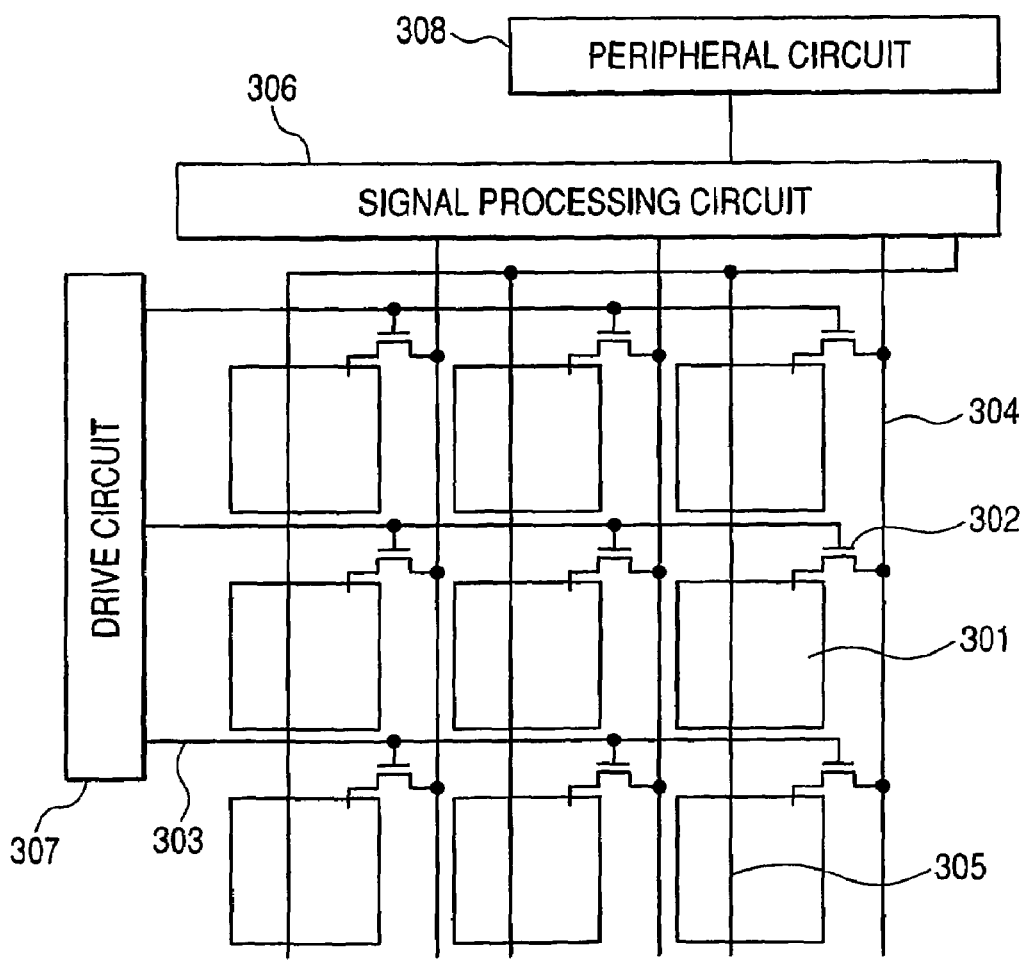
FIG. 2 is a schematic circuit diagram of the radiation detecting apparatus when pixels are arranged in a three-by-three matrix.

FIG. 2 is a schematic circuit diagram of the radiation detecting apparatus when pixels are arranged in a three-by-three matrix. Referring to FIG. 2, the reference numeral 301 denotes an MIS type sensor which is of the conversion element, the reference numeral 302 denotes the TFT which transfers a signal from the MIS type sensor 301 to a signal line 304, and the reference numeral 303 denotes a gate drive interconnection through which a control signal is sent to the TFT 302. The reference numeral 304 denotes the signal line, and the reference numeral 305 denotes a sensor bias line. The sensor bias line 305 is arranged in a column direction, and a common bias is applied to upper electrodes on the MIS type sensor 301 through the sensor bias line 305. The reference numeral 306 denotes a signal processing circuit. The signal processing circuit 306 is connected to the signal line 304, and an electric signal is inputted to the signal processing circuit 306. The reference numeral 307 denotes a drive circuit which applies a scanning signal to the gate drive interconnection 303, and the reference numeral 308 denotes peripheral circuits such as an A/D converter.

Figure 3:
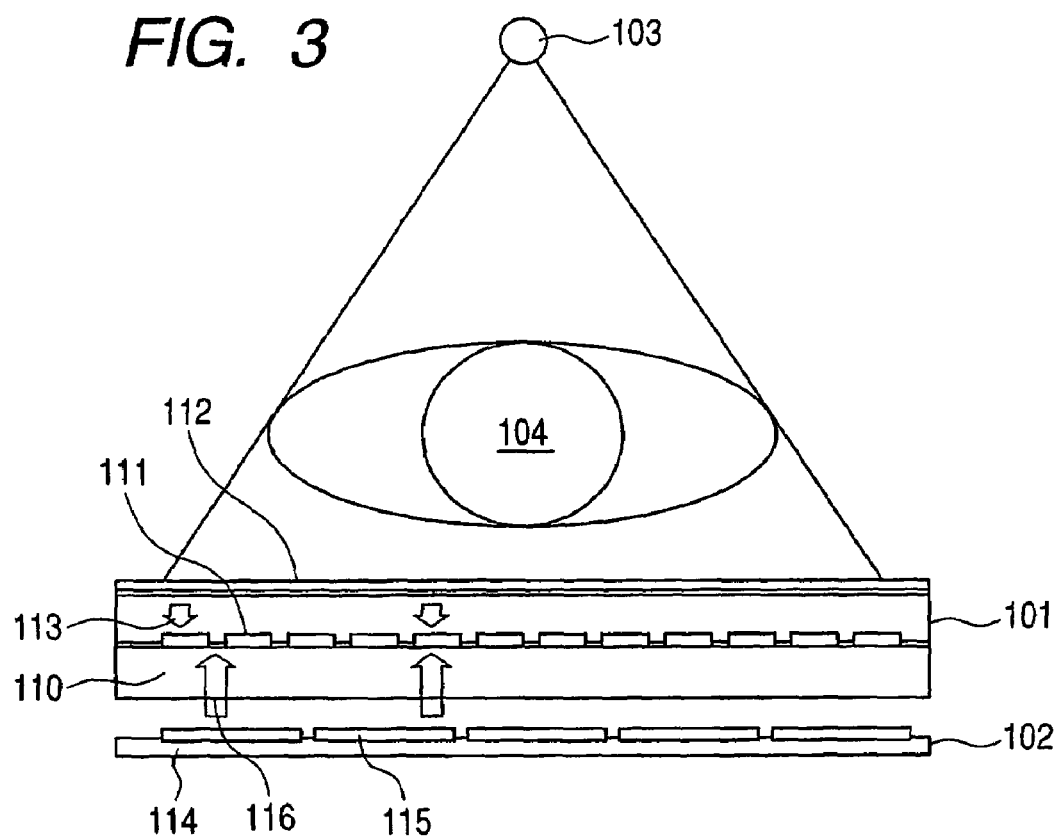
FIG. 3 is a schematic sectional view when a light source is arranged in the radiation detecting apparatus.

FIG. 3 is a schematic sectional view when the light source is arranged in the radiation detecting apparatus. The reference numeral 101 denotes a sensor substrate in which pixels having both the conversion elements and the switching are elements are formed in the two-dimensional matrix. The reference numeral 102 denotes a light source which irradiates the surface (backside) opposite to the light acceptance surface of the sensor substrate 101 with the light. The reference numeral 103 denotes a radiation source which emits the radiation such as the X-ray, and the reference numeral 104 denotes a test body (human body in this case) which is irradiated with the radiation such as the X-ray. In the sensor substrate 101, pixels 111 are arranged in the two-dimensional manner on the light-transmitting insulating substrate 110 such as the glass substrate. The pixel 111 includes the MIS type sensor which is of the conversion element and the TFT which is of the switching element. The scintillator layer 112 which performs wavelength conversion of the radiation such as the X-ray is disposed over the pixels 111. As described above, the lower electrode (electrode on the substrate side) of the MIS type sensor is made of ITO which is of the light-transmitting conductive material. The radiation such as the X-ray transmitted through the test body 104 is converted into light 113 such as the visible light and the infrared ray by the scintillator layer 112 made of cesium iodide (CsI), and the light 113 is incident to the pixel 111. On the other hand, in the light source 102, plural LEDs 115 are arranged in the two-dimensional manner on a light source substrate 114. The light source 102 is arranged on the backside of the sensor substrate 101. Light 116 with which the light source 102 irradiates the sensor substrate 101 is incident to the pixel 111 from the backside (surface opposite to the surface in which the pixels are provided) of the sensor substrate 101.

The lower electrode (electrode on the substrate side) of the MIS type sensor is made of the light-transmitting conductive material, allowing the absorption of the light from the light source 102 arranged on the backside of the sensor substrate 101. Therefore, the method in which the image can immediately be read by performing the light irradiation prior to the reading operation can be adopted to immediately read the image.

Second Embodiment

A radiation detecting apparatus according to a second embodiment will be described below. In the radiation detecting apparatus of the second embodiment, a sensor substrate is prepared, and the scintillator layer which is of the wavelength converter is formed on the sensor substrate. In the sensor substrate, a PIN type sensor which is of the conversion element is laminated on the TFT which is of the switching element through the interlayer insulating layer. In the second embodiment, similarly to the arrangement shown in FIG. 3, the light source is arranged on the backside (surface opposite to the surface in which the pixels are provided) of the light-transmitting insulating substrate, and the sensor substrate is irradiated with the light from the light source.

Figure 4:
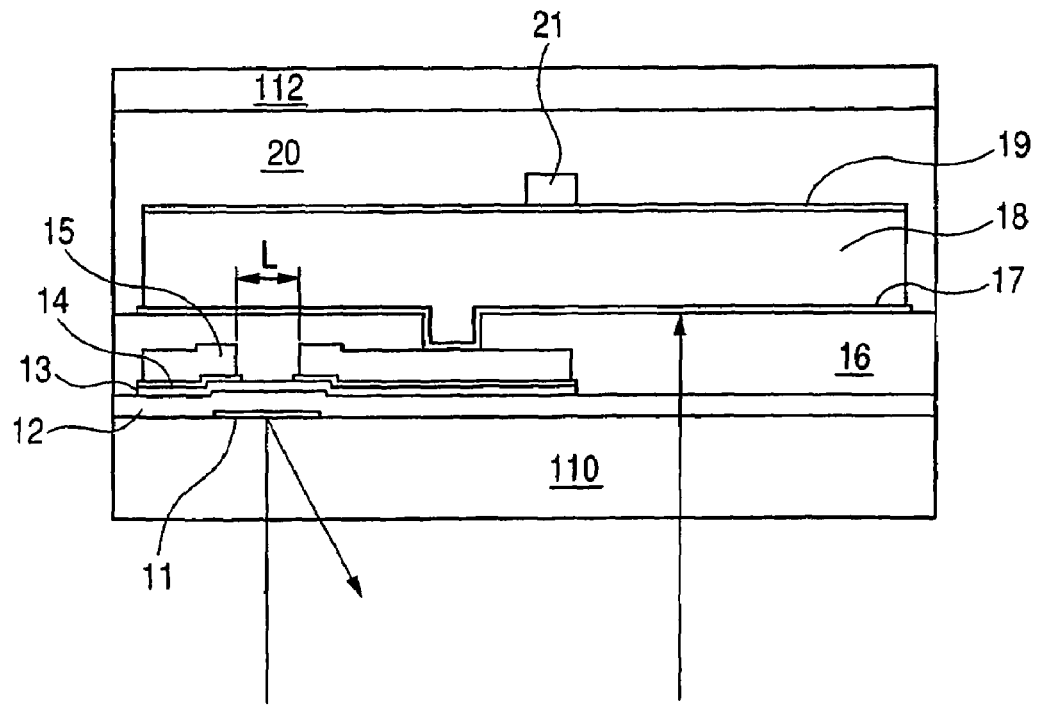
FIG. 4 is a schematic sectional view showing one pixel of a radiation detecting apparatus according to a second embodiment of the invention.

FIG. 4 is a schematic sectional view showing one pixel of a radiation detecting apparatus of the second embodiment of the invention. The reference numeral 110 denotes the light-transmitting insulating substrate such as the glass substrate. The reference numeral 11 denotes a gate electrode of the TFT which is of the switching element formed on the insulating substrate 110. The reference numeral 12 denotes a gate insulating layer, the reference numeral 13 denotes a semiconductor layer made of a-Si of the TFT which is of switching element, the reference numeral 14 denotes a semiconductor layer which function as the ohmic contact layer, the reference numeral 15 denotes a source and drain electrode of the TFT which is of the switching element, and the reference numeral 16 denotes an interlayer insulating layer. The reference numeral 17 denotes a lower electrode (electrode on the substrate side) of the PIN type sensor which is of the conversion element, the reference numeral 18 denotes a semiconductor layer made of a-Si of the PIN type sensor, the reference numeral 19 denotes an upper electrode (electrode on the side opposite to the substrate) of the PIN type sensor, the reference numeral 20 denotes a protective layer, and the reference numeral 21 denotes a sensor bias line. The reference numeral 112 denotes the scintillator layer made of cesium iodide (CsI). The scintillator layer 112, which is of the wavelength converter, converts the incident radiation such as the X-ray into the light such as the visible light and the infrared ray having the wavelength which can be detected by the PIN type sensor. In the configuration of the second embodiment, the gate insulating layer 12, the interlayer insulating layer 16, and the protective layer 20 transmit the light from the scintillator layer 112 and the light source. The lower electrode (electrode on the side where the light source is arranged) of the PIN type sensor which is of the conversion element is made of a material which transmits the light from the light source, e.g., the light transmitting conductive material such as ITO. On the other hand, the gate electrode of the TFT which is of the switching element is made of a light shielding material which blocks the light from the light source in order to prevent the incidence of the light from the light source to the TFT channel region. Desirably the area of the gate electrode is formed larger than that of the TFT channel region.

In the configuration of the second embodiment, the PIN type sensor which is of the conversion element is laminated and disposed over the TFT which is of the switching element, and the PIN type sensor is formed after the TFT is produced. Therefore, the TFT can be optimized, i.e., the TFT has the structure in which high-speed operation can be performed, and the high numerical aperture, i.e., high sensitivity can be achieved.

Specifically, in the TFT, a high heat-resistant and low electrically resistant metal material such as the Al alloy is used as the gate electrode 11, the a-Si film suitable to the TFT is used as the semiconductor layer 13 of the TFT, and an Al interconnection is used as the signal line to realize low-noise and high-speed TFT. On the other hand, because the PIN type sensor is formed after the TFT is formed, the semiconductor layer suitable to the sensor can be used. Furthermore, and the PIN type sensor which is of the conversion element can also be formed immediately above TFT which is of the switching element. Therefore, the numerical aperture can be improved.

In the light transmitting material such as ITO, transmittance is varied by heat treatment. For example, when the heat treatment is performed at around 250° C. after the lower electrode is formed with ITO, it is confirmed that the transmittance is decrease. That is, the high-temperature heat treatment is performed above 250° C. after the lower electrode 17 made of the light transmitting material such as ITO is formed in the sensor, which results in the decrease in transmittance. Accordingly, when the light transmitting material such as ITO is used as the lower electrode 17 of the sensor, it is desirable that the sensor be formed through a production process whose temperature is lower than 250° C. in order to suppress the decrease in transmittance.

In this case, the lower electrode 17 of the sensor is made of the light transmitting material such as ITO and the gate electrode is made of the light shielding material. Therefore, the gate electrode 11 blocks the light emitted from the light source through the backside (surface opposite to the surface in which the PIN type sensor is formed) of the light-transmitting insulating substrate 110, and the light can efficiently be incident to the semiconductor layer 18 (photoelectric conversion layer) through the lower electrode 17 of the sensor.

The second embodiment is the structure in which the TFT which is of the switching element and the PIN type sensor which is of the conversion element are laminated together through the interlayer insulating layer 16, so that the PIN type sensor and the TFT can individually optimized as described above and the high sensitivity can be achieved. In addition, the TFT gate electrode has the light shielding structure for the light irradiation from the light source arranged on the backside, and the light-transmitting conductive material can be used as the lower electrode to be able to irradiate the PIN type sensor with the light. The TFT gate electrode functions as the light shielding layer which prevents the TFT channel from being irradiated with the light emitted from the light source arranged on the backside. Desirably a width of the gate electrode is formed larger than a channel length (distance L between the source electrode and the drain electrode), and desirably the area of the gate electrode is set larger than that of the TFT channel region.

An organic insulating layer having the light transmitting property can be used as the interlayer insulating layer 16. For example, a general positive type acrylic resin (OPTOMER PC, product name of JSR Corporation), benzocyclobutene (CYCLOTEN, product name of The Dow Chemical Company), and polyimide are used as the organic insulating layer having the light transmitting property. When compared with the inorganic SiN layer, the organic insulating layer has a low dielectric constant, and the organic insulating layer also has an advantage that the thick film can be formed in the range of 2 to 10 µm. In the second embodiment, preferably the thickness of the organic insulating layer ranges from 2 to 10 µm, and more preferably the thickness ranges from 4 to 6 µm. In the case of the structure in which the PIN type sensor is disposed in the upper portion of the TFT, from the viewpoint of suppression of parasitic capacitance, preferably the planarization layer is formed by the low-dielectric organic insulating layer whose thickness can be formed thick. When an inorganic insulating layer such as SiN is used as the interlayer insulating layer 16, it is difficult that the inorganic insulating layer is deposited to the thickness ranging 2 to 10 µm. The interlayer insulating layer 16 may be formed by providing the organic insulating layer on the inorganic insulating layer such as the SiN layer. In the case of gap-etching type TFT as shown in FIG. 4, it is particularly desirable that the inorganic insulating layer such as SiN be used as a first layer to stabilize the gap portion. However, generally the dielectric constant of the inorganic insulating layer such as SiN is substantially double the organic insulating layer, so that the thickness of the inorganic insulating layer is formed to a minimal range of 100 to 200 nm in order to achieve characteristic stabilization. Desirably a second interlayer insulating layer made of the organic insulating layer is laminated on a first interlayer insulating layer made of the inorganic insulating layer such as SiN in order to decrease the parasitic capacitance.

In the second embodiment, the sensor lower electrode made of the light-transmitting conductive material such as ITO is disposed over the interlayer insulating layer made of the light-transmitting organic insulating layer. Therefore, the irradiation light from the backside can efficiently be introduced into the sensor.

When the interlayer insulating layer 16 is formed with the thickness more than 1 µm only using the inorganic insulating layer such as SiN, large stress is generated and thereby sometimes there is a problem that warping or cracking is created in the substrate. In order to reduce the stress, there is proposed a method of using a layer in which a Si ratio is high. However, when the Si ratio becomes high, the transmittance of the layer is decreased, and sometimes the sensor is not sufficiently irradiated with the light from the backside. For the above reason, it is desirable to dispose the interlayer insulating layer 16 formed by the combination of the inorganic insulating layer and the organic insulating layer.

In consideration of the TFT structure or reliability, obviously it is also possible that the single organic insulating layer is used as the interlayer insulating layer. For example, when the gap stopper type TFT is used as the switching element, it is possible that the single organic insulating layer is disposed as the interlayer insulating layer. Instead, it is desirable to use the single organic insulating layer from the viewpoint of realization of the low cost. That is, the combination of ITO and the organic insulating layer realizes the performance improvement and the low cost.

The light incident from the backside of the insulating substrate 110 reaches the semiconductor layer 18 of the PIN type sensor through the insulating substrate 110, the interlayer insulating layer 16, and the sensor lower electrode 17 made of the light-transmitting conductive material. At this point, the refractive index of glass which is of the insulating substrate 110 ranges about 1.5 to about 1.6, the refractive index of the organic insulating layer which is of the interlayer insulating layer 16 ranges about 1.6 to about 1.7, and the refractive index of ITO which is of the sensor lower electrode 17 ranges about 1.8 to about 1.9. The refractive index is gradually increased from the light incident side. Because a difference in refractive index between interfaces is as small as not more than 0.2, the reflection of the light from the backside can be decreased at each interface. As a result, the semiconductor layer 18 of the sensor is efficiently irradiated with the light from the backside. On the other hand, when the inorganic insulating layer is used as the interlayer insulating layer 16, because the refractive index of the inorganic insulating layer becomes about 2.5, the difference in refractive index becomes larger between the interlayer insulating layer 16 and the sensor lower electrode 17. Therefore, the light reflection becomes larger at the interface between the interlayer insulating layer 16 and the sensor lower electrode 17, and the light incidence from the backside becomes worsened. The radiation detecting apparatus is formed by selecting the materials such that the difference in refractive index becomes smaller, and desirably becomes not more than 0.2 between the interlayer insulating layer 16 and the sensor lower electrode 17. Thus, the reflection is suppressed between the interlayer insulating layer 16 and the sensor lower electrode 17, and the semiconductor layer 18 of the sensor is efficiently irradiated with the light from the backside.

Figure 8:
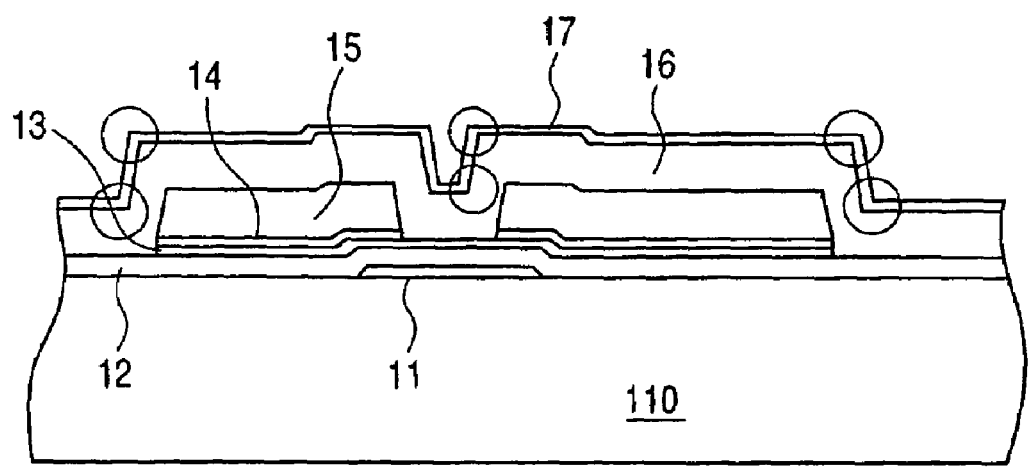
FIG. 8 is a schematic sectional view showing a configuration of a radiation detecting apparatus when an inorganic insulating layer is used as an interlayer insulating layer 16.
Figure 9:
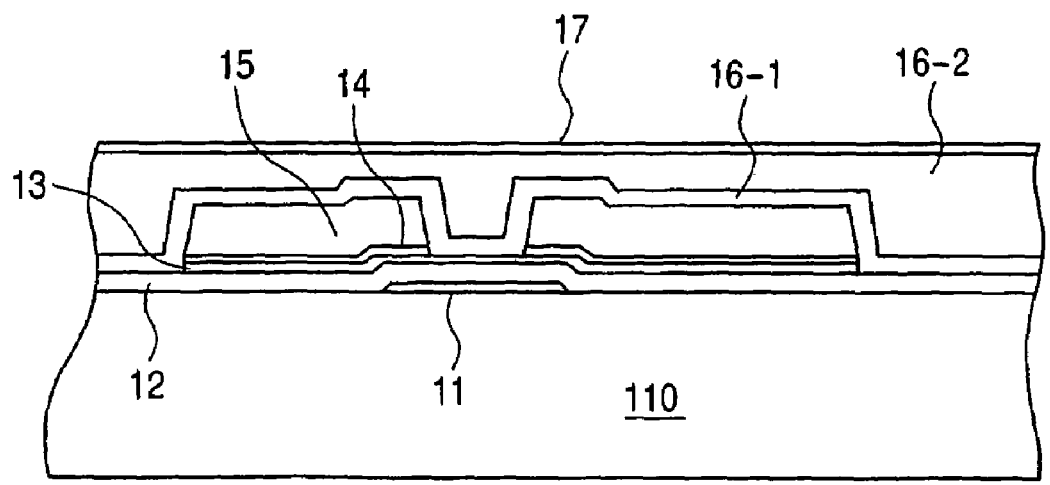
FIG. 9 is a schematic sectional view showing a configuration of a radiation detecting apparatus when the inorganic insulating layer and an organic insulating layer are used as the interlayer insulating layer 16.

As shown in FIG. 8, when the inorganic insulating layer is used as the interlayer insulating layer 16, steps in portions shown by circles of FIG. 8 remain intact. Therefore, the steps have an influence on the sensor disposed above the interlayer insulating layer 16, and there is a possibility that a sensor defect is generated such that the sensor lower electrode located on the step is not well formed or a short circuit is generated between the sensor upper electrode and the sensor lower electrode. On the other hand, as shown in FIG. 9, when the surface of the interlayer insulating layer is planarized by arranging the inorganic insulating layer 16-1 and organic insulating layer 16-2, or at least the organic insulating layer 16-2, influence of the interconnection or the step of the TFT is released by the interlayer insulating layer, which allows the defect to be suppressed in the sensor disposed on the interlayer insulating layer.

Third Embodiment

A radiation detecting apparatus according to a third embodiment will be described below. In the radiation detecting apparatus of the third embodiment, the scintillator layer which is of the wavelength converter is disposed over the substrate. In the substrate, the plural TFTs which are of the switching element are arranged in one pixel, and the MIS type sensor which is of the conversion element is laminated on the plural TFTs through the interlayer insulating layer.

In the third embodiment, similarly to the arrangement shown in FIG. 3, the light source is arranged on the backside (surface opposite to the surface in which the pixels are provided) of the light-transmitting insulating substrate, the light from the light source is transmitted through the light-transmitting insulating substrate, and the conversion element is irradiated with the light.

Figure 5:
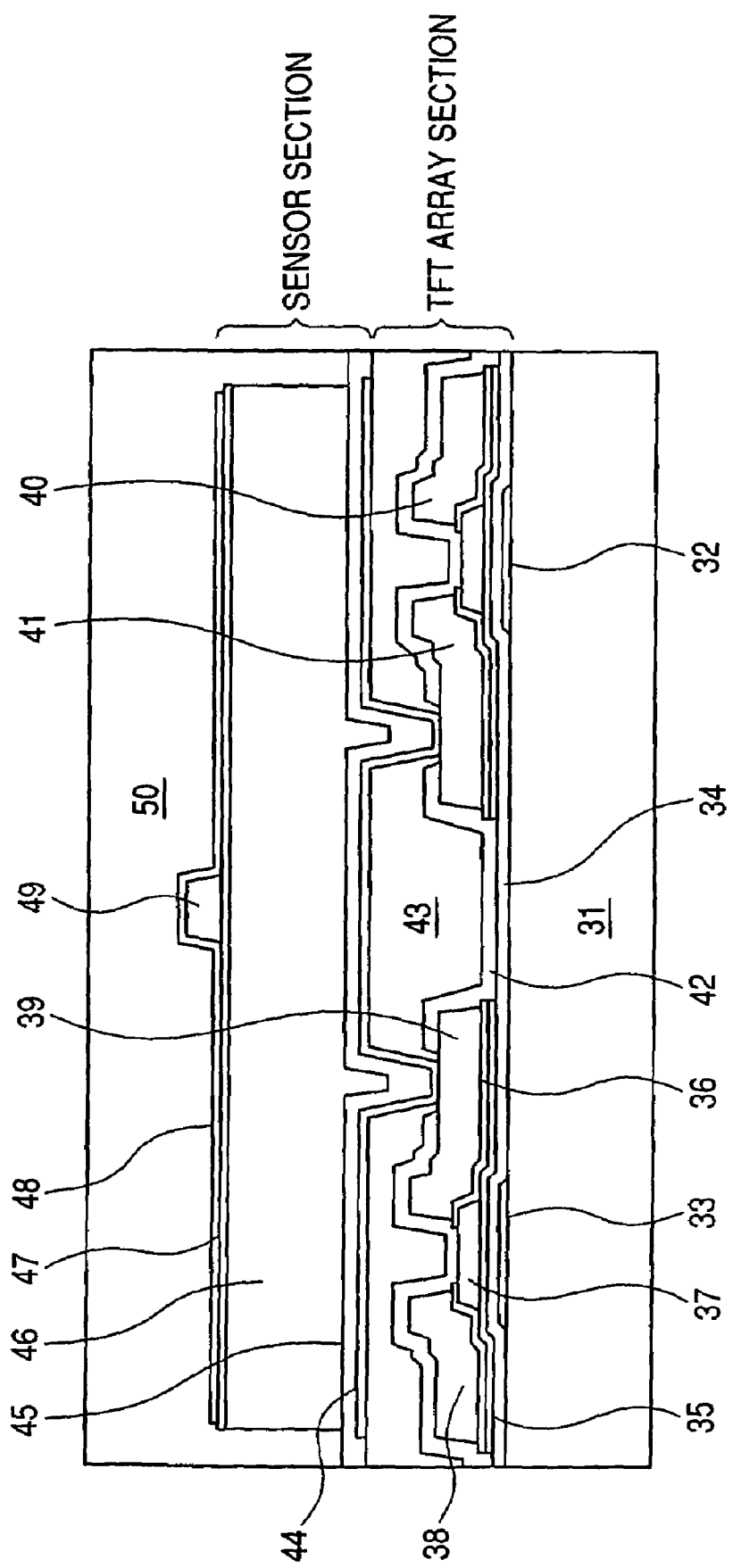
FIG. 5 is a schematic sectional view showing one pixel of a radiation detecting apparatus according to a third embodiment of the invention.

FIG. 5 is a schematic sectional view showing one pixel of a radiation detecting apparatus of the third embodiment of the invention. Referring to FIG. 5, the reference numeral 31 denotes a light-transmitting insulating substrate such as the glass substrate. The reference numeral 32 denotes a gate electrode of transferring TFT which is of the transferring switching element formed on the insulating substrate 31. The reference numeral 33 denotes a gate electrode of resetting TFT which is of the switching element for resetting the conversion element. The reference numeral 34 denotes a gate insulating layer, the reference numeral 35 denotes a semiconductor layer made of a-Si or the like of the transferring TFT and resetting TFT, the reference numeral 36 denotes an impurity semiconductor layer which functions as the ohmic contact layer of the transferring TFT and resetting TFT, and the reference numeral 37 denotes a gap protection film of the transferring TFT and resetting TFT.

The reference numeral 38 denotes a resetting TFT source electrode connected to a reset bias line (not shown), and the reference numeral 39 denotes a resetting TFT drain electrode connected to the sensor lower electrode. The reference numeral 40 denotes a transferring TFT source electrode connected to the signal line (not shown), the reference numeral 41 denotes a transferring TFT drain electrode connected to the sensor lower electrode. The reference numeral 42 denotes a protective layer, the reference numeral 43 denotes an interlayer insulating layer, the reference numeral 44 denotes a lower electrode of the MIS type sensor which is of the conversion element, the reference numeral 45 denotes an insulating layer of the MIS type sensor, the reference numeral 46 denotes a semiconductor layer of the MIS type sensor, the reference numeral 47 denotes an impurity semiconductor layer which functions as the MIS type ohmic contact layer, the reference numeral 48 denotes an upper electrode of the MIS type sensor, the reference numeral 49 denotes a sensor bias interconnection, the reference numeral 50 denotes a scintillator layer which is of the wavelength converter made of cesium iodide (CsI).

In the third embodiment, the low electrical-resistance metal interconnection having the light shielding function is also used as the transferring TFT gate electrode 32, the resetting TFT gate electrode 33, and the gate interconnection, and ITO which is of the light-transmitting conductive material is used as the sensor lower electrode 44. The gate electrodes 32 and 33 function as the light shielding layer which prevents the TFT channel from irradiating with the light from the light source arrange on the backside. Desirably the width of the gate electrode is formed larger than a channel length (distance L between the source electrode and the drain electrode), and desirably the area of the gate electrode is set larger than that of the TFT channel region. As a result, the light from the light source arranged on the backside can sufficiently be introduced into the sensor, and the unnecessary light incidence to the TFT can be prevented. Because the third embodiment has the laminated structure, the plural TFTs can be arranged without decreasing the numerical aperture, the high-speed drive, the high sensitivity, and the high reliability can simultaneously be achieved.

Figure 6:
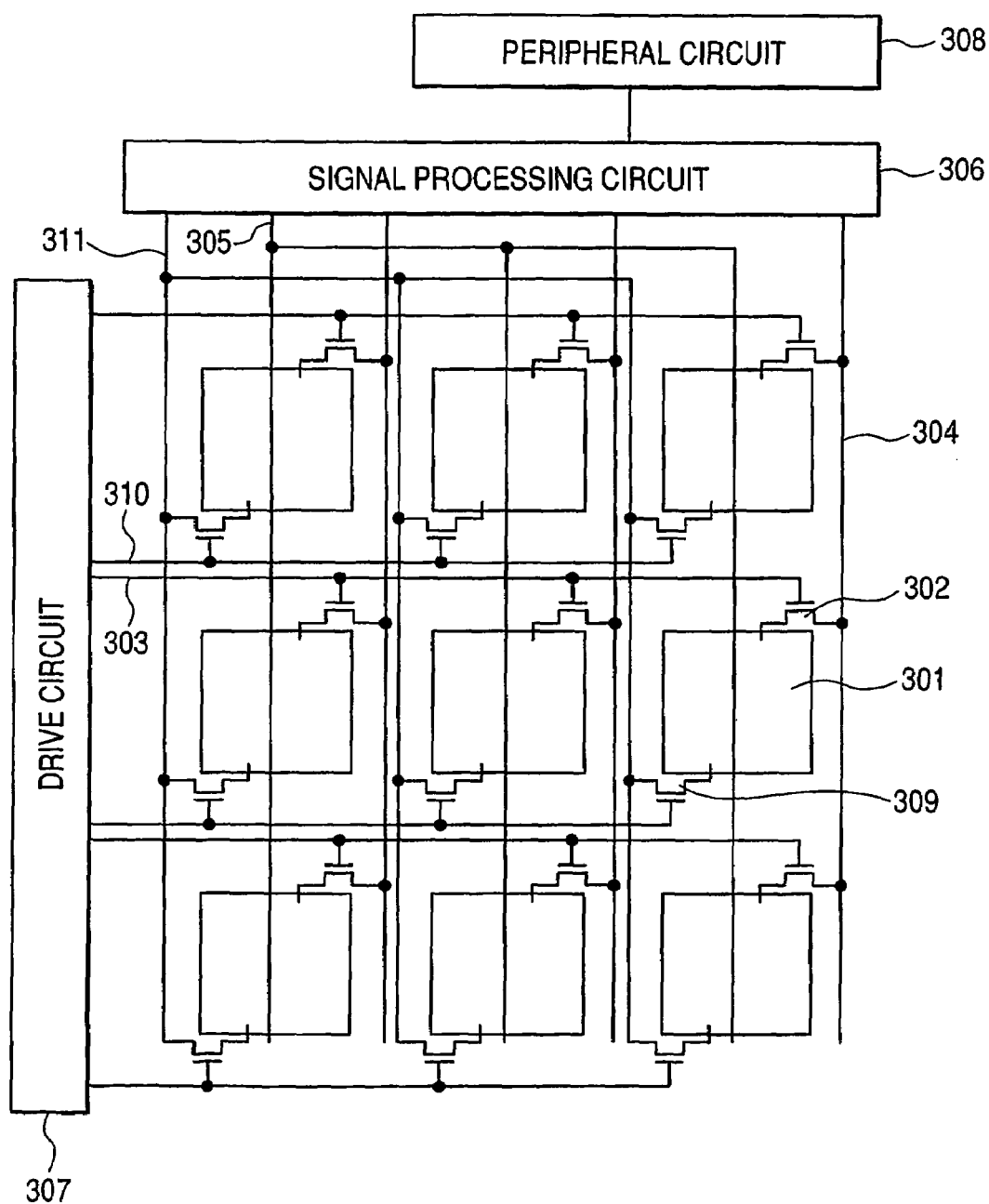
FIG. 6 is a schematic circuit diagram of the radiation detecting apparatus according to the third embodiment of the invention.

FIG. 6 shows a schematic circuit diagram of the third embodiment. Referring to FIG. 6, the reference numeral 301 denotes a MIS type sensor, the reference numeral 302 denotes a transferring TFT which transfers the signal from the MIS type sensor 301 to a signal line 304, the reference numeral 303 denotes a gate drive interconnection through which the control signal is sent to the transferring TFT 302, the reference numeral 304 denotes a signal line, and the reference numeral 305 denotes a sensor bias line. The sensor bias line 305 is arranged in the column direction, and the common bias is applied to upper electrodes on the MIS type sensor through the sensor bias line 305. The reference numeral 306 denotes a signal processing circuit. The signal processing circuit 306 is connected to the signal line 304, and the electric signal is inputted to the signal processing circuit 306. The reference numeral 307 denotes a drive circuit which sequentially applies the scanning signal to the gate drive interconnection 303 and a gate drive interconnection 310, and the reference numeral 308 denotes peripheral circuits such as the A/D converter, the reference numeral 309 denotes a resetting TFT, the reference numeral 310 denotes the gate drive interconnection through which the control signal is sent to the resetting TFT 309, and the reference numeral 311 denotes a reset bias line which imparts a reset voltage to the resetting TFT 309.

The scintillator layer (not shown) which is of the wavelength converter converts the radiation such as the X-ray into the light such as the visible light and the infrared ray having the wavelength which can be detected by the conversion element, and the light is incident to the MIS type sensor 301 which is of the conversion element. The photoelectric conversion is performed to the incident light and the charge is accumulated in the MIS type sensor 301. Then, the charge is read to the signal processing circuit 306 and the peripheral circuit 308 by the transfer operation of the transferring TFT 302. Then, the MIS type sensor 301 is reset by operating the resetting TFT 309. In the structure of the third embodiment, the readout, reset, accumulation can be performed in each line using the transferring TFT and resetting TFT, and the radiation detecting apparatus can substantially be driven in the sum of the readout times. That is, the readout operation is performed in one line, and the sensor on the already read line is reset at the same time. As a result, the moving picture can be driven at high speed not lower than 30 FPS without degrading the image quality.

Thus, the control of the light irradiation in the above embodiments is required to solve the fundamental problem of the a-Si thin film and, according to the study of the inventors, desirably the whole of the a-Si thin film is irradiated with the light. Particularly it is important to reset a semiconductor junction interface portion of the electrode-side photoelectric conversion element connected to the TFT. The charge generated by the light irradiation is accumulated in the semiconductor junction interface portion.

On the other hand, in order to improve the sensitivity (including noise reduction), it is desirable that the a-Si thin film be formed thick. Therefore, it is difficult that the sensor is irradiated with the light from above to reset the whole of semiconductor thin film or the semiconductor interface on the TFT connection side. When the light is incident from the backside, the semiconductor interface on the TFT connection side which is of the most important portion can be reset, and the whole of semiconductor thin film can efficiently be irradiated with the light.

In the above embodiments, the scintillator layer and the photoelectric conversion element which is of the conversion element are used in the radiation detecting apparatus. However, the invention is not limited to the embodiments. For example, the invention can be applied to the radiation detecting apparatus in which a direct type conversion element is used. In the direct type conversion element, the semiconductor layer made of a-Se (amorphous selenium) or the like is used, and the semiconductor layer directly converts the radiation into the charge. This is because the a-Se material is basically the amorphous material having the structure defect therein like a-Si.

In the above embodiments, the scintillator layer made of CsI or the like is directly deposited on the photoelectric conversion element such as the MIS type sensor. Alternatively, the scintillator layer is formed on the substrate made of a material such as carbon which transmits the light, and the surface of the scintillator layer may be bonded to the substrate in which the pixel is provided. The TFT and the photoelectric conversion element such as the MIS type sensor are coupled in the pixel.

As shown in FIG. 3, the light source in which LEDs 115 are arranged in the two-dimensional manner with respect to the sensor substrate is used in the above embodiments. However, the light source may be configured by arranging LEDs in an end face of a light guide as shown in FIG. 11 disclosed in US 2002/0024016, and the light source such as LED may be arranged in a side face of the substrate as shown in FIG. 12 disclosed in US Patent Publication No. 2002/0024016. In this case, the light incident from the end face of the light guide or the side face of the substrate, and the reflected light is incident to the photoelectric conversion element or the direct type conversion element. That is, the light source is not limited to the configuration of FIG. 3 when the light source can be configured such that the light is incident from the side opposite to the light incident side from the scintillator layer.

Then, a radiation detecting system in which the radiation detecting apparatus of the invention is used will be described with reference to FIG. 7.

Figure 7:
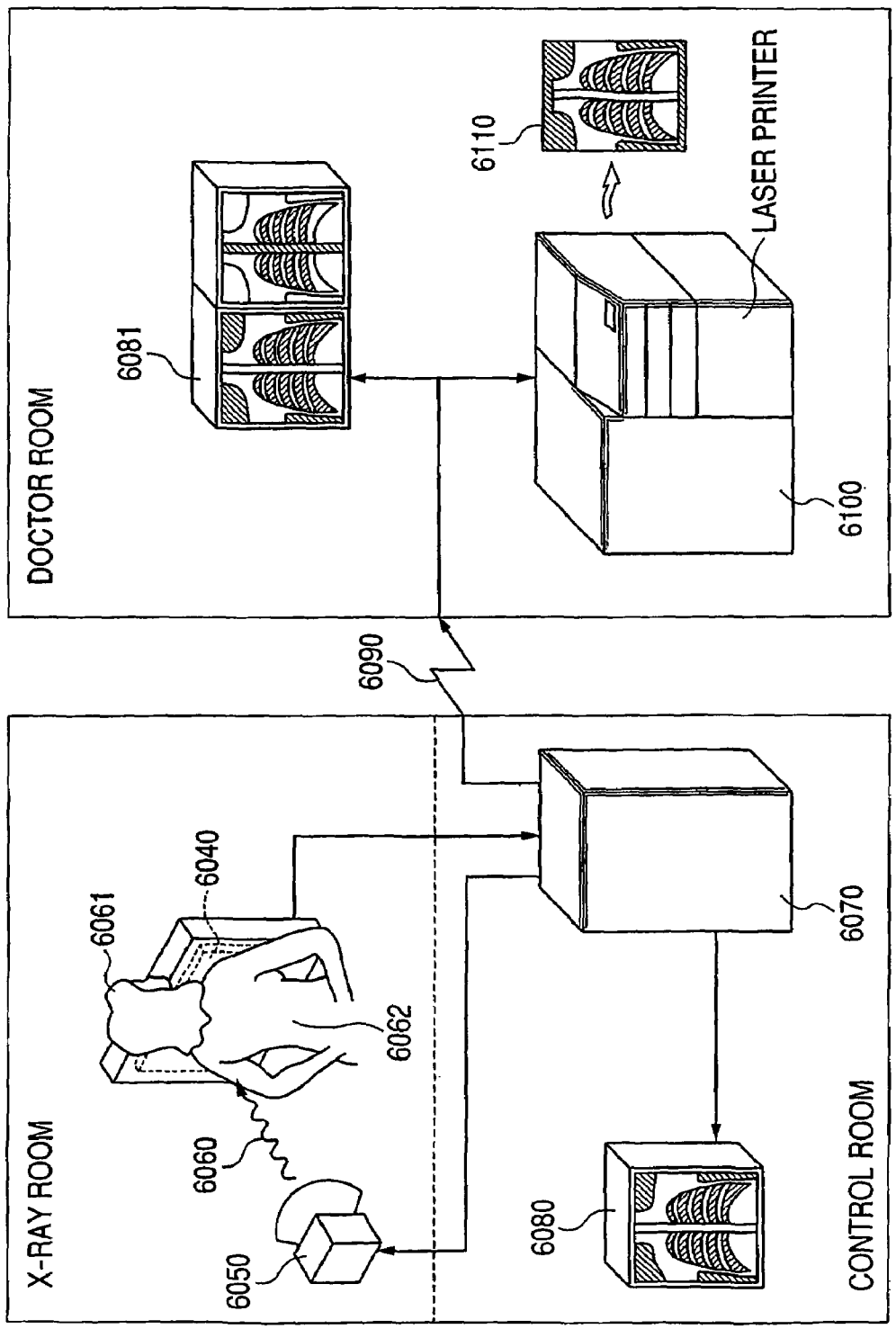
FIG. 7 shows a radiation detecting system in which the radiation detecting apparatus of the invention is used.

As shown in FIG. 7, an X-ray 6060 generated in an X-ray tube 6050 which is of the radiation source is transmitted through a breast 6062 of a patient or subject 6061, and the X-ray 6060 is incident to a radiation detecting apparatus 6040. The incident X-ray includes information on the inside of the body of the patient 6061. The scintillator layer of the radiation detecting apparatus 6040 is emitted according to the incidence of the X-ray, and the photoelectric conversion is performed to the emitted light to obtain electric information. The electric information is converted into digital information, image processing is performed by an image processor 6070 which is of signal processing means, and the inside of the body of the patient 6061 can be observed on a display 6080 which is of display means in a control room.

The information on the inside of the body of the patient 6061 can be transferred to a remote site through transmitting means such as a public telephone line 6090, and the information can be displayed on a display 6081 which is of the display means in a doctor room located at another place, or the information can be stored in a recording medium such as an optical disk using recording means such as an optical disk drive. Therefore, a doctor located on the remote site can make a diagnosis. The information can be recorded in a film 6110 with a film processor 6100.

Thus, the radiation detecting apparatus and the radiation detecting system therewith are described. According to the technical though of the invention, the invention is not limited to the radiation detecting apparatus and the radiation detecting system therewith, but the invention can be applied to an photoelectric conversion apparatus which converts the incident light such as the visible light and the infrared ray into the electric signal without providing the scintillator layer.

As many apparently widely different embodiments of the present invention can be made without departing from the spirit and scope thereof, it is to be understood that the invention is not limited to the specific embodiments thereof except as defined in the claims.

CAPABLE OF EXPLOITATION IN INDUSTRY

The invention is applied to the radiation detecting apparatus which detects radiation such as the visible light, the infrared ray, the X-ray, the alpha ray, the beta ray and the gamma ray. Particularly the invention is suitable to the radiation detecting apparatus which detects the radiation such as the X-ray, the alpha ray, the beta ray and the gamma ray, and the invention is applied to the medical diagnostic imaging system, the nondestructive inspection apparatus, and the analytical apparatus in which the radiation is used.

This application claims priority from Japanese Patent Application No. 2005-214226 filed on Jul. 25, 2005, which is hereby incorporated by reference herein.

The invention claimed is:

1. A radiation detecting apparatus in which a plurality of pixels are arranged, each pixel having a conversion element converting a radiation incident from a side opposite to an insulating substrate into an electric signal and a switching element connected to the conversion element, the conversion element including a first electrode disposed on a first surface side of the insulating substrate, a second electrode disposed on the first electrode and a semiconductor layer disposed between the first electrode and the second electrode, wherein the switching element has a source electrode, a drain electrode, a semiconductor layer having a channel region, and a gate electrode, and wherein a light-transmitting interlayer insulating layer is disposed on the switching element, and a portion of the first electrode of the conversion element is disposed over the light-transmitting interlayer insulating layer and covers at least a portion of the channel region, and wherein the first electrode is formed from a light transmitting electroconductive material transmitting light emitted from the insulating substrate side, and the switching element has a light shielding member which prevents incidence of the light from the insulating substrate side to the switching element.

2. The radiation detecting apparatus according to claim 1, wherein the switching element is disposed over the insulating substrate, and the light shielding member is the gate electrode made of metal material.

3. The radiation detecting apparatus according to claim 2, wherein the gate electrode is made of Al alloy.

4. The radiation detecting apparatus according to claim 1, wherein the light shielding member has an area larger than an area of a channel region of the switching element, and the light shielding member is disposed between the channel region and the insulating substrate.

5. The radiation detecting apparatus according to claim 1, wherein a thickness of the light-transmitting interlayer insulating layer ranges from 2 to 10 μm.

6. The radiation detecting apparatus according to claim 1, wherein a refractive index of the first electrode is larger than a refractive index of the light-transmitting interlayer insulating layer, and a difference in refractive index is not more than 0.2 between the first electrode and the light-transmitting interlayer insulating layer.

7. The radiation detecting apparatus according to claim 1, wherein the photoelectric conversion element is an MIS type sensor.

8. The radiation detecting apparatus according to claim 1, wherein the photoelectric conversion element is a PIN type sensor.

9. The radiation detecting apparatus according to claim 1, wherein a wavelength converter is disposed, the wavelength converter converting radiation incident to the photoelectric conversion element into light having a wavelength range which can be detected by the photoelectric conversion element.

10. The radiation detecting apparatus according to claim 1, wherein the conversion element is a semiconductor element which converts incident radiation into an electric signal.

11. A radiation image pickup system comprising:
a radiation detecting apparatus according to claim 1;
signal processing means for processing a signal from the radiation detecting apparatus;
recording means for recording the signal from the signal processing means;
display means for displaying the signal from the signal processing means;
transmitting means for transmitting the signal from the signal processing means; and
a radiation source which generates radiation.

12. The radiation detecting apparatus according to claim 1, further comprising:
a light source disposed on a second surface side of the insulating substrate opposite to the first surface side.

13. The radiation detecting apparatus according to claim 1, wherein the switching element has a transferring TFT and a resetting TFT.

14. The radiation detecting apparatus according to claim 1, wherein the first electrode is made of ITO.

15. The radiation detecting apparatus according to claim 1, wherein the light shielding member is positioned to allow incidence of the light from the insulating substrate side to at least a portion of the light-transmitting interlayer insulating layer.

16. The radiation detecting apparatus according to claim 1, wherein the insulating substrate is a light-transmitting insulating substrate.

* * * * *